US010374039B1

(12) United States Patent
Hashemi et al.

(10) Patent No.: US 10,374,039 B1
(45) Date of Patent: Aug. 6, 2019

(54) ENHANCED FIELD BIPOLAR RESISTIVE RAM INTEGRATED WITH FDSOI TECHNOLOGY

(71) Applicant: International Business Machines Corporation, Armonk, NY (US)

(72) Inventors: Pouya Hashemi, White Plains, NY (US); Takashi Ando, Tuckahoe, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/962,848

(22) Filed: Apr. 25, 2018

(51) Int. Cl.
| | | |
|---|---|---|
| *H01L 27/12* | (2006.01) | |
| *H01L 29/08* | (2006.01) | |
| *H01L 29/786* | (2006.01) | |
| *H01L 29/10* | (2006.01) | |
| *H01L 29/66* | (2006.01) | |
| *H01L 45/00* | (2006.01) | |
| *H01L 27/24* | (2006.01) | |

(52) U.S. Cl.
CPC ...... *H01L 29/0847* (2013.01); *H01L 27/1203* (2013.01); *H01L 27/2436* (2013.01); *H01L 29/1033* (2013.01); *H01L 29/66772* (2013.01); *H01L 29/78654* (2013.01); *H01L 45/08* (2013.01); *H01L 45/1233* (2013.01); *H01L 45/1608* (2013.01)

(58) Field of Classification Search
USPC ............... 438/300, 197, 17, 268, 585, 592; 257/347, 377, 384, 412, 755, E21.051, 257/E21.41, E29.255, E29.262, 288, 329; 365/185.18, 189.011, 189.09, 191
See application file for complete search history.

(56) References Cited

U.S. PATENT DOCUMENTS

| | | | |
|---|---|---|---|
| 9,466,794 B2 | 10/2016 | Yang et al. | |
| 9,490,427 B2 * | 11/2016 | Sutardja | G11C 13/0007 |
| 9,768,381 B2 | 9/2017 | Park et al. | |
| 9,831,288 B2 | 11/2017 | Grenouillet et al. | |

(Continued)

OTHER PUBLICATIONS

Anonymous, "Differential Spacer with 2-Stage RSD Formation for High Performance, Low Capacitance FDSOI", IPCOM000251679D, Nov. 22, 2017, 4 pages.

(Continued)

*Primary Examiner* — Niki H Nguyen
(74) *Attorney, Agent, or Firm* — Scully, Scott, Murphy & Presser, P.C.; L. Jeffrey Kelly, Esq.

(57) ABSTRACT

A resistive random access memory stack is formed on a surface of a faceted drain-side structure that is present on one side of a functional gate structure. The functional gate structure and the faceted drain-side structure are located on a topmost surface of a fully depleted semiconductor channel material layer. In some embodiments, the resistive random access memory stack includes a bottom electrode, a resistive switching layer and a top electrode. In other embodiments, the resistive random access memory stack includes a resistive switching layer and a top electrode. In such an embodiment, a drain-side metal semiconductor alloy of the faceted drain-side structure is used as the bottom electrode of the resistive random access memory device.

20 Claims, 6 Drawing Sheets

(56) References Cited

U.S. PATENT DOCUMENTS

| | | | |
|---|---|---|---|
| 9,893,149 B2 | 2/2018 | Cea et al. | |
| 2015/0061010 A1* | 3/2015 | Cheng | H01L 29/0692 |
| | | | 257/344 |
| 2015/0311257 A1* | 10/2015 | Nardi | H01L 27/2463 |
| | | | 257/4 |
| 2017/0047285 A1* | 2/2017 | Cheng | H01L 23/5252 |
| 2017/0162786 A1 | 6/2017 | Lee et al. | |
| 2017/0345870 A1 | 11/2017 | Tseng et al. | |

OTHER PUBLICATIONS

Pan, H.W., et al.,"1Kbit FINFET Dielectric (FIND) RRAM in Pure 16nm FinFET CMOS Logic Process", Electron Devices Meeting (IEDM), Date of Conference: Dec. 7-9, 2015 IEEE International, 4 pages.

\* cited by examiner

ENHANCED FIELD BIPOLAR RESISTIVE RAM INTEGRATED WITH FDSOI TECHNOLOGY

BACKGROUND

The present application relates to a semiconductor structure and a method of forming the same. More particularly, the present application relates to a semiconductor structure including a resistive random access memory stack that is present on a surface of a faceted drain-side structure of a functional gate structure that is located on a fully depleted semiconductor channel material layer of a semiconductor-on-insulator (SOI) substrate.

Many modern day electronic devices contain electronic memory. Electronic memory may be volatile memory or non-volatile memory. Non-volatile memory retains its stored data in the absence of power, whereas volatile memory loses its stored data when power is lost. Resistive random access memory (ReRAM or RRAM) is one promising candidate for the next generation of non-volatile memory due to its simple structure and its compatibility with complementary metal-oxide-semiconductor (CMOS) logic fabrication processes.

For oxide ReRAMs, electroforming of a current conducting filament is needed. This process relies on randomness and thus the position of the filament of the oxide ReRAM is not well controlled. This results in a higher forming voltage as the ReRAM cell is scaled and higher device variability. Moreover, bipolar ReRAM is preferred, especially for neuromorphic computing which requires resistance state updates in both directions by voltages pulses with opposite polarity.

SUMMARY

A resistive random access memory stack is formed on a surface of a faceted drain-side structure that is present on one side of a functional gate structure. The functional gate structure and the faceted drain-side structure are located on a topmost surface of a fully depleted semiconductor channel material layer. In some embodiments, the resistive random access memory stack includes a bottom electrode, a resistive switching layer and a top electrode. In other embodiments, the resistive random access memory stack includes a resistive switching layer and a top electrode. In such an embodiment, a drain-side metal semiconductor alloy of the faceted drain-side structure is used as the bottom electrode of the resistive random access memory device.

In one aspect of the present application, a semiconductor structure is provided. In one embodiment, the semiconductor structure of the present application includes a functional gate structure located on a topmost surface of a fully depleted semiconductor channel material layer. A faceted drain-side structure is located on the topmost surface of the fully depleted semiconductor channel material layer and is present on a first side of the functional gate structure, and a faceted source-side structure is located on the topmost surface of the fully depleted semiconductor channel material layer and is present on a second side of the functional gate structure that is opposite the first side. A resistive random access memory stack is located on a surface of the faceted drain-side structure.

In another aspect of the present application, a method of forming a semiconductor structure is provided. In one embodiment, the method includes forming a gate structure (functional or sacrificial) on a topmost surface of a fully depleted semiconductor channel material layer. A faceted drain-side structure is formed on the topmost surface of the fully depleted semiconductor channel material layer and on a first side of the gate structure, and a faceted source-side structure is formed on the topmost surface of the fully depleted semiconductor channel material layer and on a second side of the gate structure that is opposite the first side. Next, an interlayer dielectric (ILD) material is formed laterally adjacent the gate stack and atop the faceted drain-side structure, and atop the faceted source-side structure, and thereafter a contact opening is formed in the ILD material to physically expose a surface of the faceted drain-side structure. A resistive random access memory stack is then formed in the contact opening and on the physically exposed surface of the faceted drain-side structure. When a sacrificial gate structure is used, the sacrificial gate structure may be replaced with a functional gate structure anytime after forming the faceted drain and faceted source-side structures.

DETAILED DESCRIPTION

Figure 1:
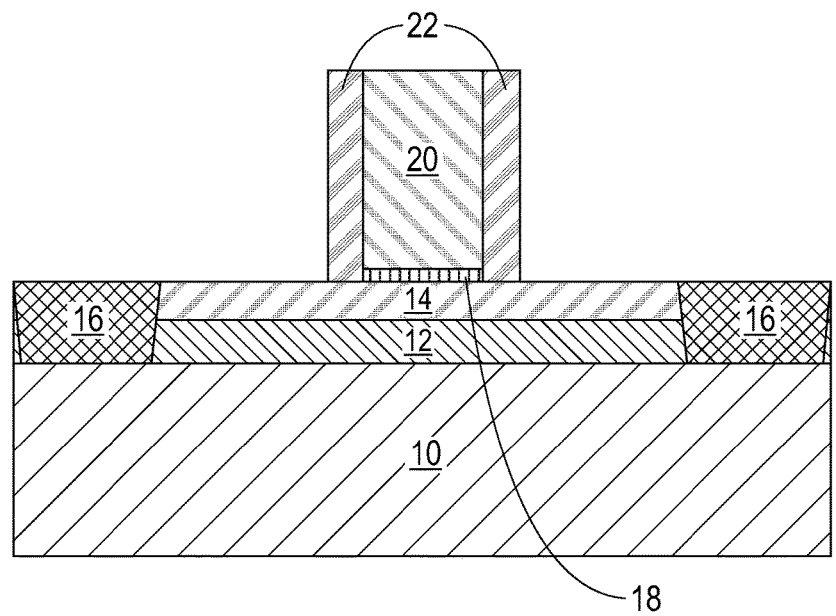
FIG. 1 is a cross sectional view of an exemplary semiconductor structure of the present application during an early stage of fabrication and including a gate structure located on a topmost surface of a fully depleted semiconductor channel material layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure of the resent application during an early stage of fabrication and including a gate structure (18/20) located on a topmost surface of a fully depleted semiconductor channel material layer 14. The fully depleted semiconductor channel material layer 14 is located on an insulator layer 12 which is present on a handle substrate 10. Collectively, the fully depleted semiconductor channel material layer 14, the insulator layer 12 and the handle substrate 10 may be referred to as a fully depleted semiconductor-on-insulator (FDSOI) substrate. The handle substrate 10 provides mechanical support to the insulator layer 12 and the fully depleted semiconductor channel material layer 14.

In the present application, the fully depleted semiconductor channel material layer 14 is a very thin layer so that the depletion region covers the whole film. In FDSOI technology, the insulator layer of the SOI substrate reduces parasitic capacitance resulting in higher switching speeds. It also efficiently confines the carriers (electrons/holes) flowing from the source to the drain, enabling a substantial reduction of short channel effects (SCEs) and allowing a FDSOI MOSFET to work at lower gate bias resulting in lower power operation.

The handle substrate 10 and the fully depleted semiconductor channel material layer 14 are composed of at least one semiconductor material having semiconductor properties. In some embodiments of the present application, the handle substrate 10 and the fully depleted semiconductor channel material layer 14 may comprise a same semiconductor material. In other embodiments of the present application, the handle substrate 10 and the fully depleted semiconductor channel material layer 14 may be composed of a different semiconductor material. Exemplary semiconductor materials that can be used in providing the handle substrate 10 and the fully depleted semiconductor channel material layer 14 include silicon (Si), germanium (Ge), a silicon germanium alloy (SiGe), a silicon germanium carbide alloy (SiGeC), a III-V compound semiconductor or a II-VI compound semiconductor. Multilayers of these semiconductor materials can also be used as the semiconductor material of the handle substrate 10 and/or the fully depleted semiconductor channel material layer 14. In one embodiment of the present application, the handle substrate 10 and the fully depleted semiconductor channel material layer 14 are both composed entirely of silicon.

The handle substrate 10 and the fully depleted semiconductor channel material layer 14 may have a same, or a different, crystal orientation. For example, the crystal orientation of the handle substrate 10 and/or the fully depleted semiconductor channel material layer 14 may be {100}, {110}, or {111}. Other crystallographic orientations besides those specifically mentioned can also be used in the present application. The handle substrate 10 may be a single crystalline semiconductor material, a polycrystalline semiconductor material, or an amorphous semiconductor material. Typically, the fully depleted semiconductor channel material layer 14 is a single crystalline semiconductor material.

The insulator layer 12 may be a crystalline or non-crystalline oxide or nitride. In one embodiment, the insulator layer 12 is an oxide such as, for example, silicon dioxide. In another embodiment, the insulator layer 12 is a nitride such as, for example, silicon nitride or boron nitride. In yet other embodiments, the insulator layer 12 is a multilayered stack of, in any order, silicon dioxide and boron nitride.

The SOI substrate may be formed utilizing standard processes including for example, SIMOX (Separation by IMplantation of OXygen) or layer transfer. When a layer transfer process is employed, an optional thinning step may follow the bonding of two semiconductor wafers together. The optional thinning step reduces the thickness of the topmost semiconductor layer of the bonded wafers to provide a fully depleted semiconductor channel material layer having a desired thickness.

The thickness of the fully depleted semiconductor channel material layer 14 is typically from 10 nm to 100 nm. The thickness of the insulator layer 12 is typically from 1 nm to 200 nm. The thickness of the handle substrate 10 is inconsequential to the present application.

The exemplary structure shown in FIG. 1 also includes an isolation structure 16 that surrounds the fully depleted semiconductor channel material layer 14, and a gate structure (18/20) which is located on a topmost surface of the fully depleted semiconductor channel material layer 14. A gate spacer 22 may be present on the sidewalls of the gate structure (18/20). Although a single gate structure (18/20) is described and illustrated, a plurality of gate structures (18/20) can be formed.

In some embodiments and as shown in FIG. 1, the isolation structure 16 may extend down to a topmost surface of the handle substrate 10. In other embodiments (not illustrated), the isolation structure 16 may extend down to a topmost surface of the insulator layer 12. The isolation structure 16 is composed of a trench dielectric material such as, for example, silicon dioxide. The isolation structure 16 may be formed by forming a trench into the SOI substrate and then filling the trench with a trench dielectric material. An optional densification process and/or planarization process may follow the trench fill. The isolation structure 16 may be formed prior to, or after, forming the gate structure (18/20). The isolation structure 16 may have a topmost surface that is coplanar with a topmost surface of the fully depleted semiconductor channel material layer 14.

In one embodiment and as shown, the gate structure is a functional gate structure. By "functional gate structure" it is meant a permanent gate structure used to control output current (i.e., flow of carriers in the channel) of a semiconducting device through electrical or magnetic fields. The functional gate structure includes a gate material stack of, from bottom to top, a gate dielectric material 18 and a gate conductor 20. In some embodiments, a gate cap (not shown) can be present atop the gate conductor 20.

The gate dielectric 18 of the functional gate structure is composed of a gate dielectric material. The gate dielectric material that provides the gate dielectric 18 can be an oxide, nitride, and/or oxynitride. In one example, the gate dielectric material that provides the gate dielectric 18 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric 18. In some embodiments and when multiple functional gate structures are formed, each gate dielectric comprises a same gate dielectric material. In other embodiments and when multiple functional gate structures are formed, the gate dielectric for a first set of the functional gate structures comprises a different gate dielectric material than the gate dielectric for a second set of the functional gate structures.

The gate dielectric material used in providing the gate dielectric 18 can be formed by any deposition process including, for example, chemical vapor deposition (CVD), plasma enhanced chemical vapor deposition (PECVD), physical vapor deposition (PVD), sputtering, or atomic layer deposition. In some embodiments and when different gate dielectric materials are used in providing the gate dielectrics of different functional gate structures, block mask technology can be used. In one embodiment of the present application, the gate dielectric material used in providing the gate dielectric 18 can have a thickness in a range from 1 nm to 10 nm. Other thicknesses that are lesser than, or greater than, the aforementioned thickness range can also be employed for the gate dielectric material.

The gate conductor 20 of the functional gate structure comprises a gate conductor material. The gate conductor material used in providing the gate conductor 20 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments and when multiple functional gate structures are formed, the gate conductor portion of each functional gate structure is a same conductive material. In other embodiments and when multiple functional gate structures are formed, the gate conductor portion of a first set of functional gate structures comprises a different gate conductor material than the gate conductor portion of a second set of functional gate structure. For example, the gate conductor portion of a first set of functional gate structures may comprise an nFET gate metal, while the gate conductor portion of a second set of functional gate structures may comprise a pFET gate metal.

The gate conductor material used in providing the gate conductor 20 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for the gate conductors of different functional gate structures, block mask technology can be used. In one embodiment, the gate conductor material used in providing the gate conductor 20 has a thickness from 50 nm to 100 nm. Other thicknesses that are lesser than, or greater than, the aforementioned thickness range can also be employed for the gate conductor material used in providing the gate conductor 20.

If present, the gate cap of the functional gate structure comprises a gate cap material. The gate cap material that provides the gate cap may include one of the hard mask materials mentioned above. In one embodiment, each gate cap is composed of silicon dioxide, silicon nitride, and/or silicon oxynitride. The material that provides the gate cap can be formed utilizing a conventional deposition process such as, for example, chemical vapor deposition or plasma enhanced chemical vapor deposition. The material that provides the gate cap can has a thickness from 5 nm to 20 nm. Other thicknesses that are lesser than, or greater than, the aforementioned thickness range can also be employed as the thickness of the material that provides the gate cap.

The functional gate structure can be formed by providing a functional gate material stack of, from bottom to top, the gate dielectric material, the gate conductor material and, if present, the gate cap material. The gate material stack can then be patterned. In one embodiment of the present application, patterning of the functional gate material stack may be performed utilizing lithography and etching.

In other embodiments of the present application, and prior to forming functional gate structure, a sacrificial gate structure is formed instead of a functional gate structure. In yet other embodiments and when multiple gate structures are formed, at least one of the gate structures is a functional gate structure, and at least one other of the gate structures is a sacrificial gate structure. By "sacrificial gate structure" it is meant a material or material stack that serves as a placeholder for a subsequently formed functional gate structure. In such a process, the functional gate structure is formed after the faceted source and faceted drain-side structure have been formed. In such an embodiment, the gate dielectric of the functional gate structure that replaces the sacrificial gate structure may be U-shaped. By "U-shaped" it is meant a material that includes a bottom horizontal surface and a sidewall surface that extends upward from the bottom horizontal surface. When employed, each sacrificial gate structure may include a sacrificial gate dielectric, a sacrificial gate material and a sacrificial gate cap. In some embodiments, each sacrificial gate dielectric and/or each sacrificial gate cap may be omitted. Each sacrificial gate dielectric includes one of the dielectric materials mentioned above for the gate dielectric. Each sacrificial gate material includes one of the gate conductor materials mentioned above for the gate conductor. The sacrificial gate cap includes one of the gate cap materials mentioned above for each gate cap. The sacrificial gate structures can be formed by deposition of the various material layers and then patterning the resultant sacrificial material stack by utilizing, for example, lithography and etching.

The gate spacer 22 may include any gate spacer dielectric material such as, for example, silicon dioxide, silicon nitride and/or silicon oxynitride. The gate spacer 22 may be formed by deposition of a continuous layer of the gate spacer dielectric material, and then performing a spacer etch. The gate spacer 22 may have a thickness from 5 nm to 20 nm; although other thicknesses for the gate spacer 22 are possible and can be used in the present application.

Figure 2:
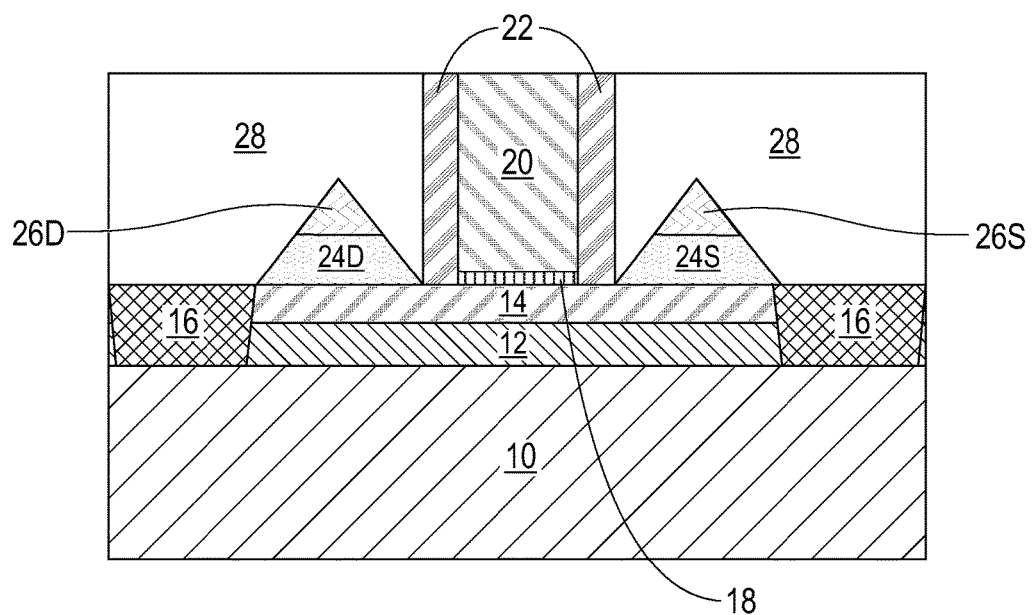
FIG. 2 is a cross sectional view of the exemplary semiconductor structure of FIG. 1 after forming a faceted drain-side structure located on a first side of the gate structure, and a faceted source-side structure located on a second side of the gate structure that is opposite the first side containing the faceted drain-side structure, and forming an interlayer dielectric (ILD) material adjacent the gate structure and over the faceted drain-side structure and the faceted source-side structure.

Referring now to FIG. 2, there is illustrated the exemplary semiconductor structure of FIG. 1 after forming a faceted drain-side structure (24D/26D) located on one side of the gate structure (18/20), and a faceted source-side structure (24S/26S) located on another side of the gate structure (18/20) that is opposite the side containing the faceted drain-side structure (24D/26D), and forming an interlayer dielectric (ILD) material 28 adjacent the gate structure (18/20) and over the faceted drain-side structure (24D/26D) and the faceted source-side structure (24S/26S).

The term "faceted" is used in the present application to denote a material or structure that has a non-planar surface. Typically, the faceted drain-side structure (24D/26D) and the faceted source-side structure (24S/26S) have a <111> bound faceted surface. In one embodiment, the faceted drain-side structure (24D/26D) and the faceted source-side structure (24S/26S) have a triangular shape including a base and a tip in which the base is located on a topmost surface of the fully depleted semiconductor channel material layer 14. The faceted surface of the faceted drain-side structure (24D/26D) provides a sharp corner (i.e., the tip) in which to form the resistive random access memory stack. The sharp corner of the faceted drain-side structure (24D/26D) enhances the field to form a current conducting filament of a resistive random access memory device.

The faceted drain-side structure (24D/26D) includes, from bottom to top, a drain-side doped semiconductor material 24D and, optionally, a drain-side metal semiconductor alloy 26D. The faceted source-side structure (24S/26S) includes, from bottom to top, a source-side doped semiconductor material 24S and, optionally, a source-side metal semiconductor alloy 26S.

The drain-side doped semiconductor material 24D includes an n-type (i.e., at least one element from Group VA of the Periodic Table of Elements (e.g., P and/or As)) or a p-type dopant (i.e., at least one element from Group IIIA of the Periodic Table of Elements (e.g., Al and/or B)) and a semiconductor material. The semiconductor material of the drain-side doped semiconductor material 24D may include any of the semiconductor materials mentioned above for fully depleted semiconductor channel material layer 14. In one embodiment of the present application, the semiconductor material of the drain-side doped semiconductor material 24D is a same semiconductor material as that of fully depleted semiconductor channel material layer 14. In one example, silicon is used as the semiconductor material of both the drain-side doped semiconductor material 24D and the fully depleted semiconductor channel material layer 14. In another embodiment, the semiconductor material of the drain-side doped semiconductor material 24D is a different semiconductor material than the fully depleted semiconductor channel material layer 14. For example, when fully depleted semiconductor channel material layer 14 is composed of silicon, then the drain-side doped semiconductor material 24D may be composed of germanium.

The source-side doped semiconductor material 24S includes an n-type (i.e., at least one element from Group VA of the Periodic Table of Elements (e.g., P and/or As)) or a p-type dopant (i.e., at least one element from Group IIIA of the Periodic Table of Elements (e.g., Al and/or B)) and a semiconductor material. The semiconductor material of the source-side doped semiconductor material 24S may include any of the semiconductor materials mentioned above for fully depleted semiconductor channel material layer 14. In one embodiment of the present application, the semiconductor material of the source-side doped semiconductor material 24S is a same semiconductor material as that of fully depleted semiconductor channel material layer 14. In one example, silicon is used as the semiconductor material of both the source-side doped semiconductor material 24S and the fully depleted semiconductor channel material layer 14. In another embodiment, the semiconductor material of the source-side doped semiconductor material 24S is a different semiconductor material than the fully depleted semiconductor channel material layer 14. For example, when fully depleted semiconductor channel material layer 14 is composed of silicon, then the source-side doped semiconductor material 24S may be composed of germanium.

In one embodiment, the dopant is present in the drain-side doped semiconductor material 24D and the source-side doped semiconductor material 24S in a concentration ranging from $4 \times 10^{20}$ atoms/cm$^3$ to $2 \times 10^{21}$ atoms/cm$^3$. The concentration of dopant within the drain-side doped semiconductor material 24D can be equal to, greater than, or less than the concentration of dopant within source-side doped semiconductor material 24S.

In one embodiment of the present application, the dopant can be uniformly present in the drain-side doped semiconductor material 24D and/or the source-side doped semiconductor material 24S. In another of the present application, the dopant can be present as a gradient in the drain-side doped semiconductor material 24D and the source-side doped semiconductor material 24S.

When present, the drain-side metal semiconductor alloy 26D is composed of an alloy of a metal semiconductor alloy forming metal and the semiconductor material of the drain-side doped semiconductor material 24D. The metal semiconductor alloy forming metal may include nickel (Ni), platinum (Pt), titanium (Ti), tungsten (W), cobalt (Co) or alloys thereof. In one example, the drain-side metal semiconductor alloy 26D may include a nickel silicide or a nickel germanide. Some dopant from the drain-side doped semiconductor material 24D may be present in the drain-side metal semiconductor alloy 26D.

When present, the source-side metal semiconductor alloy 26S is composed of an alloy of a metal semiconductor alloy forming metal and the semiconductor material of the source-side doped semiconductor material 24S. The metal semiconductor alloy forming metal may include nickel (Ni), platinum (Pt), titanium (Ti), tungsten (W), cobalt (Co) or alloys thereof. In one example, the source-side metal semiconductor alloy 26S may include a nickel silicide or a nickel germanide. Some dopant from the source-side doped semiconductor material 24S may be present in the source-side metal semiconductor alloy 26S.

The faceted drain-side structure (24D/26D) and the faceted source-side structure (24S/26SD) may be formed by first epitaxially depositing (or growing) an epitaxial doped semiconductor material and thereafter a metal semiconductor alloy forming process may optionally be employed to convert an upper portion of the epitaxial doped semiconductor material into a metal semiconductor alloy. In some embodiments, and when the gate conductor 20 is composed of a doped semiconductor material, an upper portion of the gate conductor 20 may be converted into a metal semiconductor alloy.

Notably, the drain-side doped semiconductor material 24D and the source-side doped semiconductor material 24S can be formed by a selective epitaxial growth process; by "selective" it is meant that the epitaxial semiconductor material forms only on exposed surfaces of semiconductor material, i.e., the fully depleted semiconductor channel layer 14, and not on dielectric surfaces, such as silicon dioxide or silicon nitride surfaces. In some embodiments, the selective epitaxial growth process is an in-situ doped selective epitaxial doped process. In such an embodiment, a dopant source gas is introduced during the deposition process. In some other embodiments, the selective epitaxial growth process forms an epitaxial semiconductor material that is intrinsic (i.e., non-doped) and the dopants can be introduced after deposition by one of ion implantation or gas phase doping.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. Thus, the faceted drain-side structure (24D/26D) and the faceted source-side structure (24S/26S), have an epitaxial relationship with the topmost surface of the fully depleted semiconductor channel material layer 14.

Examples of various epitaxial growth process apparatuses that can be used in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for typically ranges from 550° C. to 900° C. Although higher temperature typically results in faster deposition, the faster deposition may result in crystal defects and film cracking. A number of different sources may be used for the deposition of the drain-side doped semiconductor material 24D and the source-side doped semiconductor material 24S. In some embodiments, the gas source for the deposition of epitaxial semiconductor material includes a silicon containing gas source, a germanium containing gas source, or a combination thereof. For example, an epitaxial Si layer may be deposited from a silicon gas source that is selected from the group consisting of silane, disilane, trisilane, tetrasilane, hexachlorodisilane, tetrachlorosilane, dichlorosilane, trichlorosilane, and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

In some embodiments, and after forming the initial drain-side doped semiconductor material 24D and the initial source-side doped semiconductor material 24S, an upper portion including the faceted surface of each can be converted into a metal semiconductor alloy. That is, an upper portion of the initially formed drain-side doped semiconductor material 24D is converted into a drain-side metal semiconductor alloy 26D, while an upper portion of the initially formed source-side doped semiconductor material 24S can be converted into a source-side metal semiconductor alloy 26S. As mentioned above, the conversion is performed utilizing a metal semiconductor alloy forming process (typically referred to as a silicide process). The metal semiconductor alloy forming process includes deposition of a metal semiconductor alloy forming metal such as, for example, nickel (Ni), platinum (Pt), titanium (Ti), tungsten (W), cobalt (Co) or alloys thereof (such as, for example, NiPt alloy) and then performing an anneal. The anneal may be performed in one or more steps. The anneal is performed at a temperature in which a metal semiconductor alloy is formed. In one example, the anneal is performed at a temperature from 350° C. to 500° C. An etch may follow the anneal to remove any unreacted metal.

Following the formation of the faceted drain-side structure (24D/26D) and the faceted source-side structure (24S/26S), ILD material 28 is formed. The ILD material 28 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as ILD material 28. The use of a self-planarizing dielectric material as the ILD material 28 may avoid the need to perform a subsequent planarizing step.

In one embodiment, the ILD material 28 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the ILD material 28, a planarization process or an etch back process follows the deposition of the dielectric material that provides the ILD material 28. As is shown, the ILD material 28, which is present atop the faceted drain-side structure (24D/26D) and the faceted source-side structure (24S/26S), has a topmost surface that is coplanar with a topmost surface of the gate structure (18/20).

Figure 3:
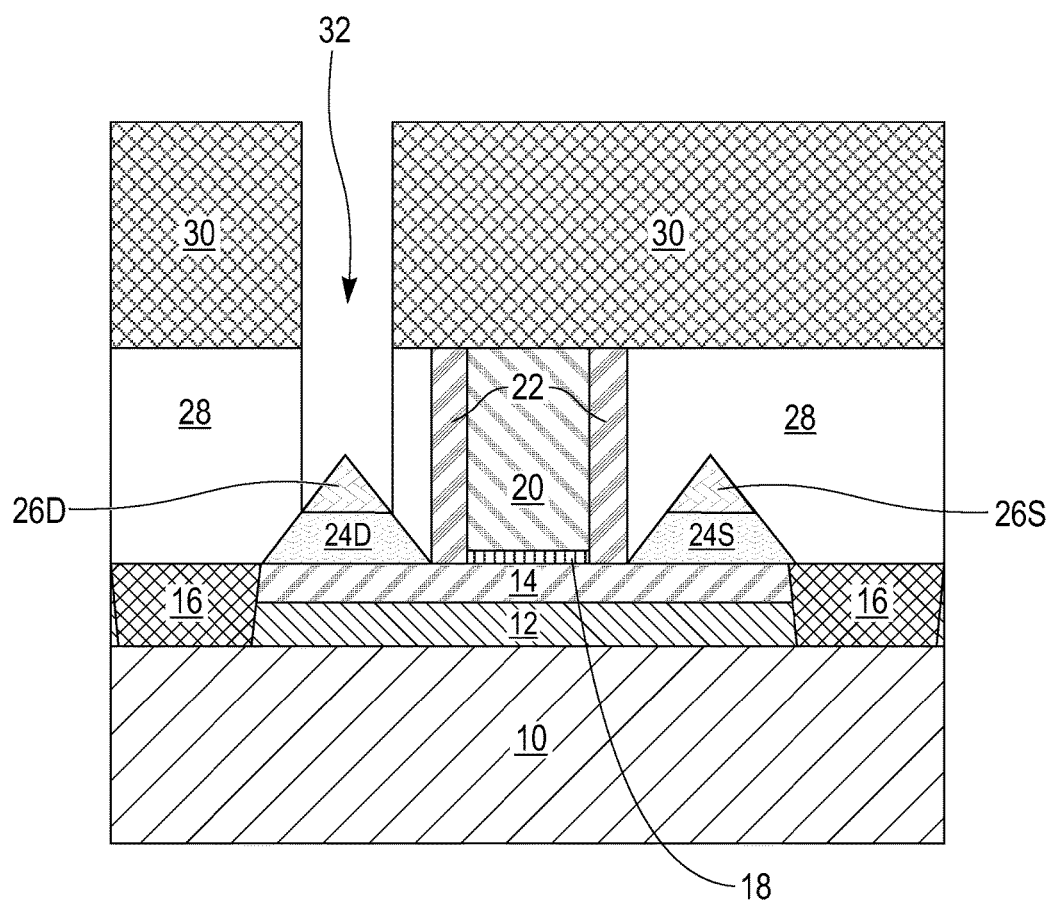
FIG. 3 is a cross sectional view of the exemplary semiconductor structure of FIG. 2 after forming a masking material including a drain-side contact opening on the ILD material, and then transferring the drain-side contact opening into the ILD material so as to physically expose a surface of the faceted drain-side structure.

Referring now to FIG. 3, there is illustrated the exemplary semiconductor structure of FIG. 2 after forming a masking material 30 including a drain-side contact opening 32 on the ILD material 28, and then transferring the drain-side contact opening 32 into the ILD material 28 so as to physically expose a surface of the faceted drain-side structure (24D/26D). No contact opening to the faceted source-side structure (24S/26S) is formed at this point of the present application.

In one embodiment, masking material 30 may include a photoresist material which can be patterned to include the drain-side contact opening 32 by the development step of a lithography process. In another embodiment, masking material 30 is composed of a hard mask dielectric material (different in composition from the ILD) which is patterned to include the drain-side contact opening 32 by forming a photoresist upon the hard mask dielectric material, patterning the photoresist by lithography, and then transferring the pattern from the photoresist into the hard mask dielectric material by etching.

The transferring of the drain-side contact opening 32 into the ILD material 28 may be performed by an etching process such as, for example, reactive ion etching. As is shown, the drain-side contact opening 32 that is now present the ILD material 28 physically exposes a surface (i.e., faceted surface) of the faceted drain-side structure (24D/26D). In the particular embodiment illustrated, the drain-side contact opening 32 physically exposes a surface (i.e., faceted surface) of the drain-side metal semiconductor alloy 26D. A portion of the underlying drain-side doped semiconductor material 24D may also be physically exposed. In other embodiments in which no drain-side metal semiconductor alloy 26D is formed, the drain-side contact opening 32 physically exposes a faceted surface of the drain-side doped semiconductor material 24D.

Figure 4:
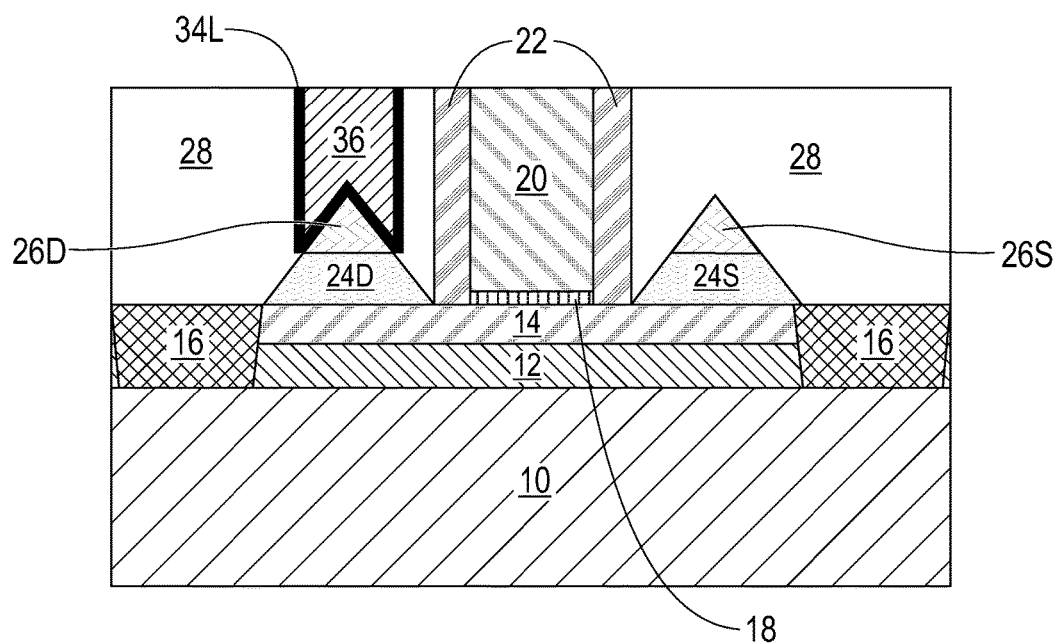
FIG. 4 is a cross sectional view of the exemplary semiconductor structure of FIG. 3 after removing the masking material, and forming a bottom electrode layer and an organic planarization layer (OPL) in the drain-side contact opening.

Referring now to FIG. 4, there is illustrated the exemplary semiconductor structure of FIG. 3 after removing the masking material 30 and forming a bottom electrode layer 34L and an organic planarization layer (OPL) 36 in the drain-side contact opening 32. The masking layer 30 may be removed utilizing a material removal process such as, for example, planarization and/or etching.

In the embodiment illustrated in FIGS. 4-7, a resistive material stack of the bottom electrode layer 34L, a resistive switching layer 40 to be subsequently described and a top electrode 42 to be subsequently described is formed. In some embodiments, the formation of the bottom electrode layer 34L and the organic planarization layer (OPL) 36 may be omitted. In such an embodiment, a resistive material stack of a resistive switching layer 40 and a top electrode 42 is formed. Also, and in the embodiment in which the formation of the bottom electrode layer 34L and the organic planarization layer (OPL) 36 is omitted, the drain-side metal semiconductor alloy 24D is used as the bottom electrode of a resistive random access material device.

In the present application, the random access material device includes a bottom electrode (i.e., composed of the bottom electrode layer or the drain-side metal semiconductor alloy 24D) a resistive switching layer (to be subsequently formed as the switching layer) and a top electrode layer to be subsequently formed. The faceted surface of the faceted drain-side structure can enhance the field to form the filament.

In the embodiment illustrated in FIG. 4, the bottom electrode layer 34L is formed in the drain-side contact opening 32 and a portion of the bottom electrode layer 34L is in direct physical contact with the physically exposed surface (i.e., the faceted surface) of the drain-side metal semiconductor alloy 26D of the faceted drain-side structure (24D/26D). The bottom electrode layer 34L may include, for example, a conductive metal, or a conductive metal nitride. The conductive metal that can provide the bottom electrode layer 34L may include at least one metal selected from Ti, Ta, Ni, Cu, W, Hf, Zr, Nb, Y, Zn, Co, Al, Si, and Ge. The conductive metal nitride the can provide the bottom electrode layer 34L may include a nitride of at least one metal selected from Ti, Ta, Ni, Cu, W, Hf, Zr, Nb, Y, Zn, Co, Al, Si, and Ge. In one embodiment, the bottom electrode layer 34L is composed of TiN or an alloy of TiN and TiAlC. The bottom electrode layer 34L may be formed by a deposition process such as, for example, chemical vapor deposition, plasma enhanced chemical vapor deposition, atomic layer deposition or sputtering. The bottom electrode layer 34L may have a thickness from 2 nm to 10 nm. Other thicknesses are possible for the bottom electrode layer 34L as long as the bottom electrode layer 34L does not fill in the entirety of the drain-side contact opening 32.

The OPL 36 may be composed of a spin-on glass (SOG) or any other self-planarizing dielectric material as long as the OPL 36 has a different composition than the ILD material 28. The OPL 36 may be formed by a deposition process such as, for example, chemical vapor deposition, plasma enhanced chemical vapor deposition or a spin-on process. The OPL 36 fills in the remaining portion of the drain-side contact opening 32. Following deposition of the materials that provide the bottom electrode layer 34L and the OPL 36, a planarization such as, for example, chemical mechanical polishing, is used to remove the bottom electrode layer 34L and the OPL 36 from atop the ILD material 28.

Figure 5:
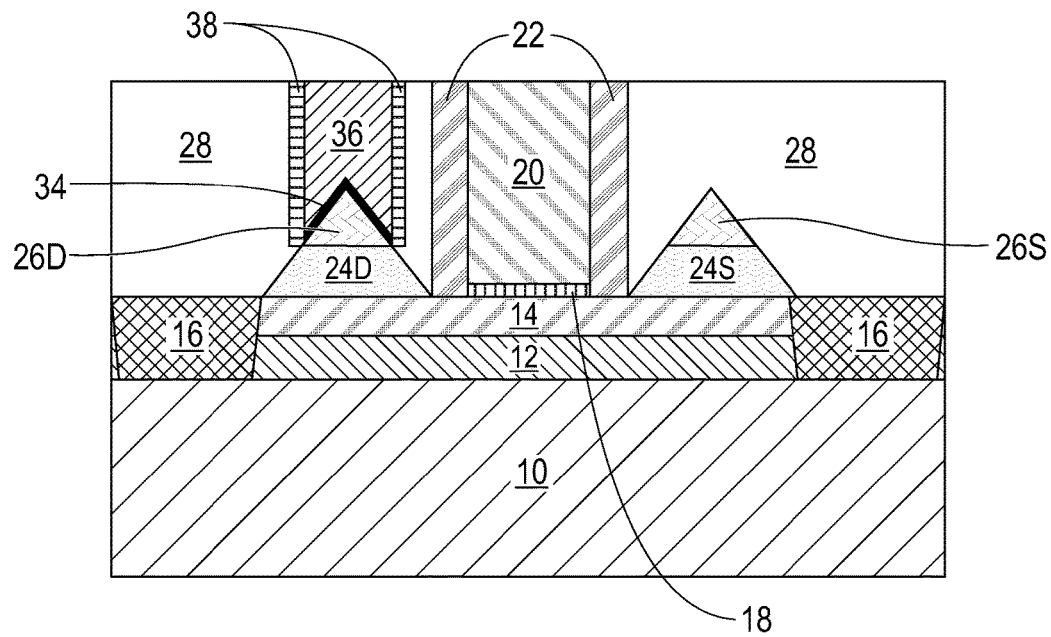
FIG. 5 is a cross sectional view of the exemplary semiconductor structure of FIG. 4 after removing vertical extending portions of the bottom electrode layer not protected by the OPL.

Referring now to FIG. 5, there is illustrated the exemplary semiconductor structure of FIG. 4 after removing vertical extending portions of the bottom electrode layer 34L not protected by the OPL 36. The vertical extending portions of the bottom electrode layer 34L not protected by the OPL 36 may be removed utilizing an etching process such as, for example, reactive ion etching that is selective in removing the conductive material that provides the bottom electrode layer 34L. A portion of the bottom electrode layer 34L remains. The portion of the bottom electrode layer 34L that remains provides the bottom electrode 34 of the resistive random access memory device of this embodiment of the present application.

Figure 6:
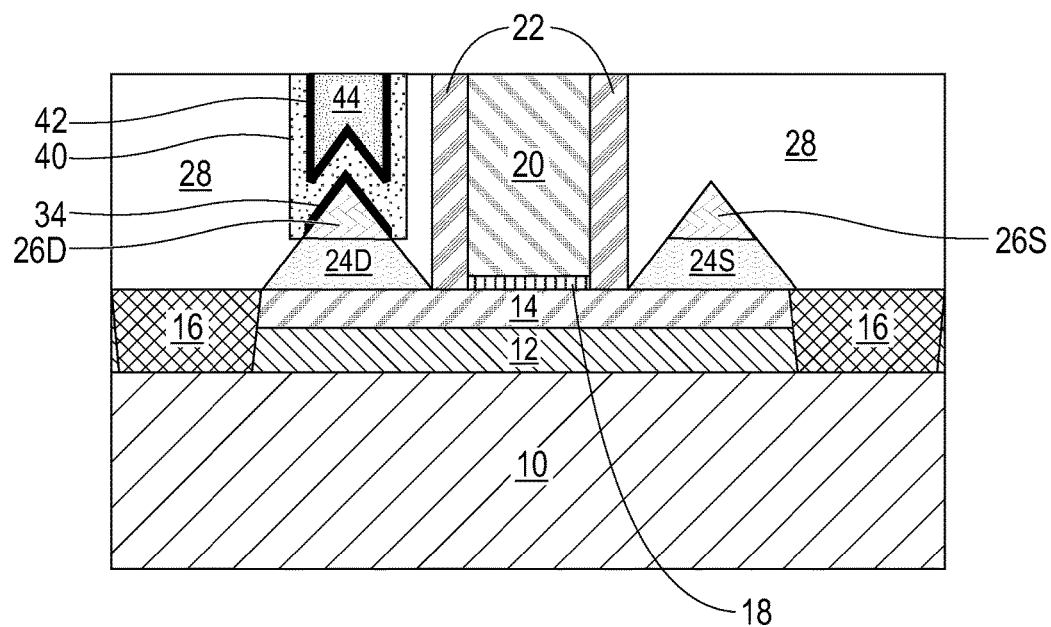
FIG. 6 is a cross sectional view of the exemplary semiconductor structure of FIG. 5 after removing the OPL, and forming a resistive switching layer, a top electrode and a drain contact metal.

Referring now to FIG. 6, there is illustrated the exemplary semiconductor structure of FIG. 5 after removing the OPL 36, and forming a resistive switching layer 40, a top electrode 42 and a drain contact metal 44. The OPL 36 may be removed utilizing an etching process that is selective in removing the material that provides the OPL 36.

The resistive switching layer 40 may include an insulating metal oxide. In some embodiments, the insulating metal oxide that provides the resistive switching layer 40 has an energy gap smaller than 5 eV. The insulating metal oxide includes at least one insulating material selected from the group consisting of $TiO_2$, NiO, HfO, $HfO_2$, ZrO, $ZrO_2$, $Ta_2O_5$, ZnO, $WO_3$, CoO and $Nb_2O_5$. Though the present application is not limited thereto, and in other embodiments, the energy gap of the resistive switching layer 40 can be adjusted according to an actual requirement. The resistive switching layer 40 may be formed by a deposition process such as, for example, chemical vapor deposition, plasma enhanced chemical vapor deposition, atomic layer deposition or sputtering. The resistive switching layer 40 may have a thickness from 2 nm to 10 nm. Other thicknesses are possible for the resistive switching layer 40 as long as the resistive switching layer 40 does not fill in the entirety of the drain-side contact opening 32.

Top electrode layer 42 is then formed on the surface of the resistive switching layer 40. The top electrode layer 42 includes one of the conductive metals or conductive metal nitrides mentioned above for the bottom electrode layer 34L. In some embodiments, the top electrode layer 42 and the bottom electrode layer 34L are composed of a same conductive metal or conductive metal nitride. In other embodiments, the top electrode layer 42 is composed of a different conductive metal or conductive metal nitride than the bottom electrode layer 34L. In one embodiment, the top electrode 42 is composed of TiN of an alloy of TiN and TiAlC. The top electrode layer 42 may be formed by a deposition process such as, for example, chemical vapor deposition, plasma enhanced chemical vapor deposition, atomic layer deposition or sputtering. The top electrode layer 42 may have a thickness from 2 nm to 10 nm. Other thicknesses are possible for the top electrode layer 42 as long as the bottom top electrode layer 42 does not fill in the entirety of the drain-side contact opening 32.

After forming the top electrode 42 and as shown in FIG. 6, a drain contact metal 44 is formed on a surface of the top electrode 42. The drain contact metal 44 may be composed of a contact metal or metal alloy. In one example, the drain contact metal 44 is composed of W or Co. The drain contact metal 44 may be formed by a deposition process such as, for example, chemical vapor deposition, plasma enhanced chemical vapor deposition, atomic layer deposition or sputtering. The drain contact metal 44 may have a thickness from 5 nm to 20 nm, sufficient to fill the drain-side contact opening 32.

In some embodiments, a diffusion barrier (not shown) such as, for example, TaN is formed between the top electrode 42 and the drain contact metal 44. The diffusion barrier may be formed by a deposition process such as, for example, chemical vapor deposition, plasma enhanced chemical vapor deposition, atomic layer deposition or sputtering. The diffusion barrier may have a thickness from 2 nm to 10 nm.

Following the deposition of the resistive switching layer 40, the top electrode 42, the optional diffusion barrier, and the drain contact metal 44, a planarization process such as, for example, chemical mechanical polishing is employed to remove any materials from the topmost surface of the ILD material 28 providing the planar structure shown in FIG. 6. In the exemplary structure shown in FIG. 6, each of the resistive switching layer 40, the top electrode 42, the optional diffusion barrier, and the drain contact metal 44 has a topmost surface that is coplanar with each other as well as being coplanar with the topmost surface of the ILD material 28. The bottom electrode 34 is buried beneath the resistive switching layer 40, the top electrode 42, the optional diffusion barrier, and the drain contact metal 44.

Figure 7:
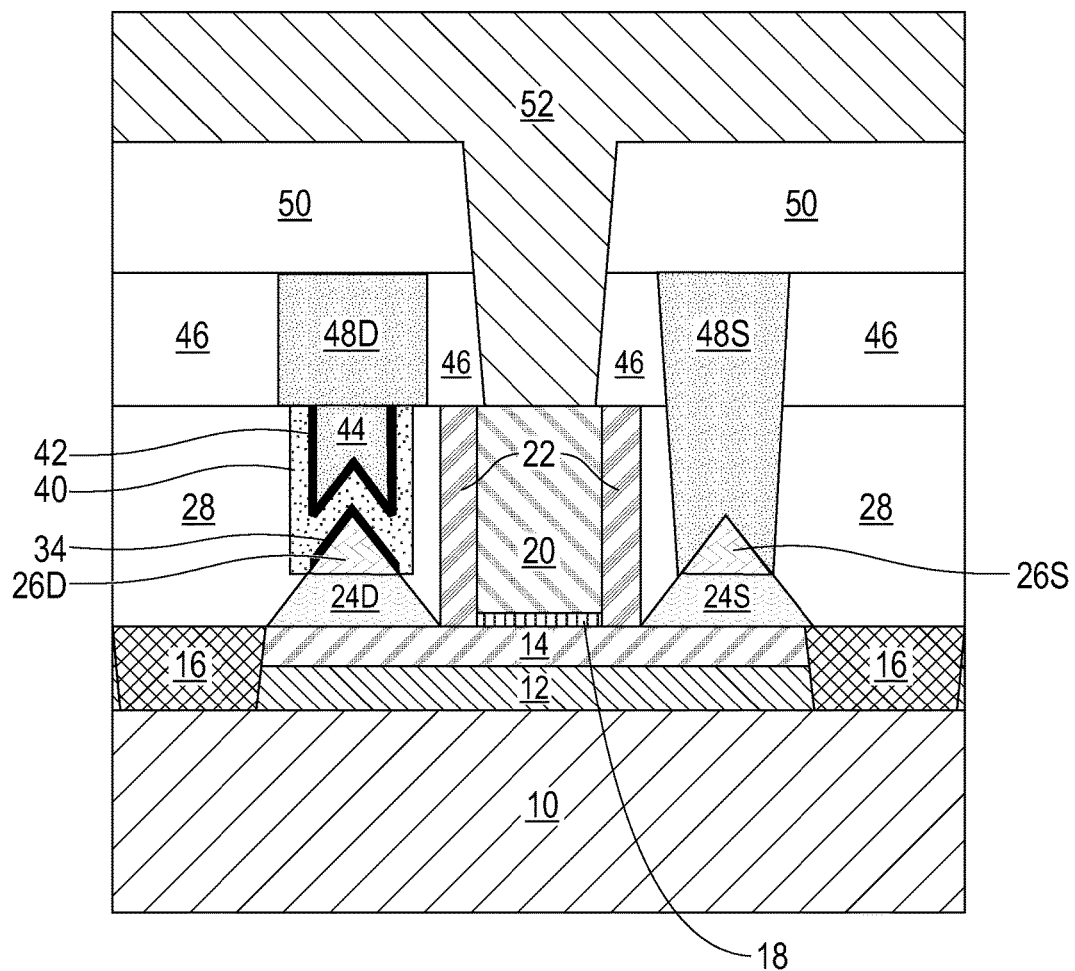
FIG. 7 is a cross sectional view of the exemplary semiconductor structure of FIG. 6 after forming a drain-side contact structure, a source-side contact structure and a gate contact structure.

Referring now to FIG. 7, there is illustrated the exemplary semiconductor structure of FIG. 6 after forming a drain-side contact structure 48D, a source-side contact structure 48S and a gate contact structure 52. In some embodiments, the formation of the gate contact structure 52 may be omitted. The drain-side contact structure 48D and the source-side contact structure 48S are formed in another ILD material 46. ILD material 46 includes one of the dielectric materials mentioned above for ILD material 28. ILD material 46 may be composed of a same, or a different dielectric material, than ILD material 28. ILD material 46 may be formed utilizing one of the techniques mentioned above in forming the ILD material 28.

The drain-side contact structure 48D and the source-side contact structure 48S are formed by first providing contact openings into ILD material 46, and then filling the contact openings with a contact metal or contact metal alloy; examples, include W, Co or alloys thereof. A planarization process may follow the filling of the contact openings with the contact metal or metal alloy. The contact openings may be formed by lithography and etching. The filling of the contact openings may be performed utilizing a deposition process.

As is shown, the drain-side contact structure 48D and the source-side contact structure 48S have topmost surfaces that are coplanar with each other as well as being coplanar with a topmost surface of the ILD material 46. The drain-side contact structure 48D has a bottommost surface that is in direct physical contact with the topmost surfaces of the resistive switching layer 40, the top electrode 42, the optional diffusion barrier, and the drain contact metal 44. The drain-side contact structure 48D may extend upon the topmost surface of the ILD material 28. In the illustrated embodiment, the source-side contact structure 48S has a bottommost surface that is in direct physical contact with the source-side metal semiconductor alloy 26S of the faceted source-side structure (24S/26S). In other embodiments, the source-side contact structure 48S has a bottommost surface that is in direct physical contact the source-side doped semiconductor material 24S.

The gate contact structure 52 is formed in another ILD material 50. ILD material 50 includes one of the dielectric materials mentioned above for ILD material 28. ILD material 50 may be composed of a same, or a different dielectric material, than ILD material 28 and/or ILD material 46. ILD material 50 may be formed utilizing one of the techniques mentioned above in forming the ILD material 28.

The gate contact structure 52 is formed by first providing contact openings into ILD material 50, and then filling the contact openings with a contact metal or contact metal alloy; examples, include W, Co or alloys thereof. A planarization process may, or may not, follow the filling of the contact openings with the contact metal or metal alloy. The contact openings may be formed by lithography and etching. The filling of the contact openings may be performed utilizing a deposition process. The gate contact structure 52 has a bottommost surface that is in direct physical contact with a topmost surface of the gate electrode 20 of the functional gate structure.

Figure 8:
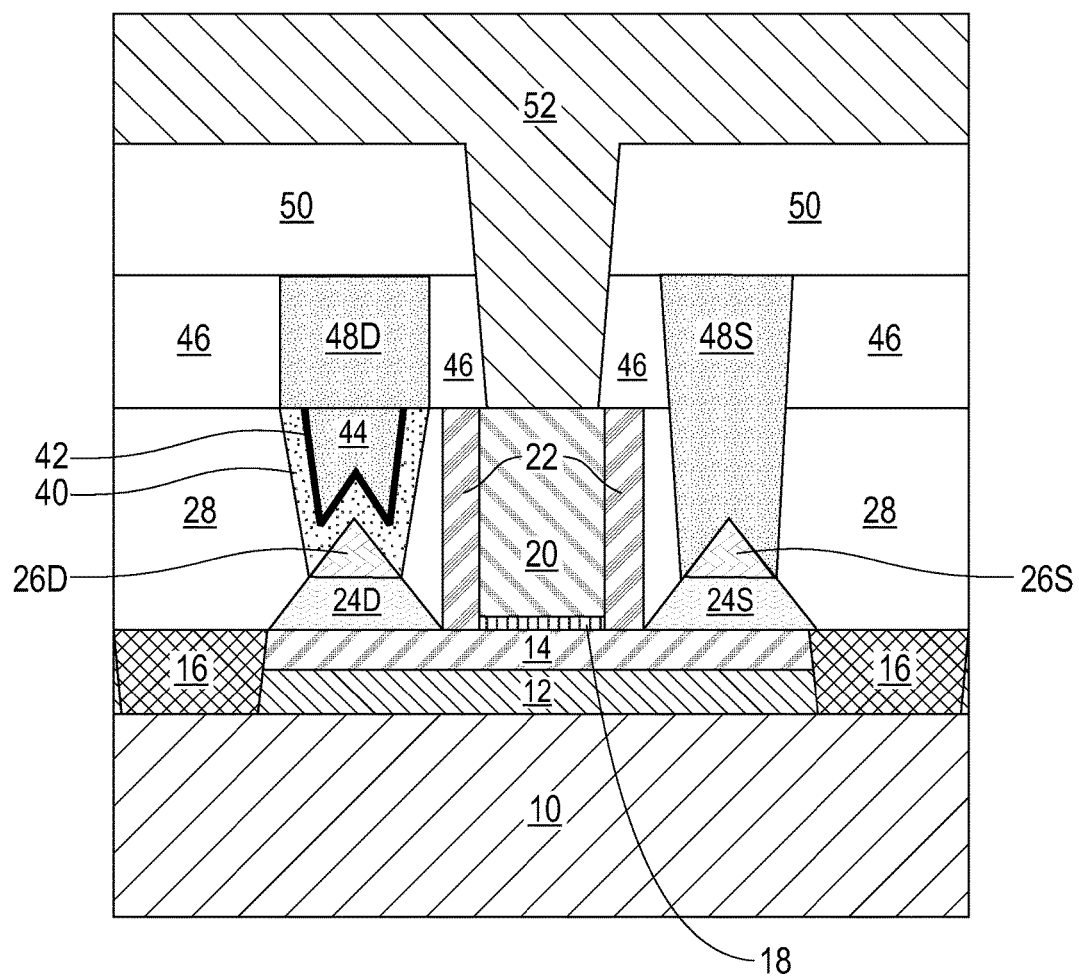
FIG. 8 is a cross sectional view of another exemplary semiconductor structure of the present application that can be prepared utilizing the basic processing steps shown in FIGS. 1-7 without forming the bottom electrode layer.

Referring now to FIG. 8, there is illustrated another exemplary semiconductor structure of the present application that can be formed utilizing the basic processing steps shown in FIGS. 1-7 without forming the bottom electrode layer 34L. In this structure, the drain-side metal semiconductor alloy 26D of the faceted drain-side structure (24D/26D) serves as the bottom electrode of the resistive random access memory device.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
    a functional gate structure located on a topmost surface of a fully depleted semiconductor channel material layer;
    a faceted drain-side structure located on the topmost surface of the fully depleted semiconductor channel material layer and present on a first side of the functional gate structure;
    a faceted source-side structure located on the topmost surface of the fully depleted semiconductor channel material layer and present on a second side of the functional gate structure that is opposite the first side; and
    a resistive random access memory stack located on a surface of the faceted drain-side structure.

2. The semiconductor structure of claim 1, wherein the resistive random access memory stack includes a bottom electrode, a resistive switching layer and a top electrode.

3. The semiconductor structure of claim 2, wherein the top electrode has a topmost surface that is coplanar with a topmost surface of the resistive switching layer, and the bottom electrode is locate entirely beneath the resistive switching layer.

4. The semiconductor structure of claim 1, wherein the resistive random access memory stack includes a resistive switching layer and a top electrode, wherein the resistive switching layer is in direct physical contact with the faceted drain-side structure.

5. The semiconductor structure of claim 4, wherein the top electrode has a topmost surface that is coplanar with a topmost surface of the resistive switching layer, and the bottom electrode is located entirely beneath the resistive switching layer.

6. The semiconductor structure of claim 1, wherein the faceted drain-side structure has a triangular shape including a base and a tip, wherein the base is located on the topmost surface of the fully depleted semiconductor channel material layer, and the tip directly contacts the resistive random access memory stack.

7. The semiconductor structure of claim 1, wherein the faceted drain-side structure comprises, from bottom to top, a drain-side doped semiconductor material and a drain-side metal semiconductor alloy.

8. The semiconductor structure of claim 1, further comprising an interlayer dielectric (ILD) material laterally adjacent the resistive random access memory stack and the functional gate stack.

9. The semiconductor structure of claim 1, further comprising a drain contact metal located on a surface of a top electrode of the resistive random access memory stack.

10. The semiconductor structure of claim 9, further comprising a drain-side contact structure contacting the drain contact metal, a source-side contact structure contacting the faceted source-side structure, and a gate contact structure contacting a gate conductor of the functional gate structure.

11. The semiconductor structure of claim 1, wherein the fully depleted semiconductor channel material layer is located on an insulator layer, and the insulator layer is located on a handle substrate.

12. The semiconductor structure of claim 1, wherein an isolation structure surrounds the fully depleted semiconductor channel material layer.

13. A method of forming a semiconductor structure, the method comprising:
 forming a gate structure on a topmost surface of a fully depleted semiconductor channel material layer;
 forming a faceted drain-side structure on the topmost surface of the fully depleted semiconductor channel material layer and on a first side of the gate structure, and a faceted source-side structure on the topmost surface of the fully depleted semiconductor channel material layer and on a second side of the gate structure that is opposite the first side;
 forming an interlayer dielectric (ILD) material laterally adjacent the gate stack and atop the faceted drain-side structure, and atop the faceted source-side structure;
 forming a contact opening in the ILD material to physically expose a surface of the faceted drain-side structure; and
 forming a resistive random access memory stack in the contact opening and on the physically exposed surface of the faceted drain-side structure.

14. The method of claim 13, wherein the forming the resistive random access memory stack comprises:
 forming a bottom electrode layer in the drain-side contact opening and on the physically exposed surface of the faceted drain-side structure;
 forming an organic planarization layer (OPL) on the bottom electrode;
 removing vertical extending portions of the bottom electrode layer not protected by the OPL;
 removing the OPL;
 forming a resistive switching layer; and
 forming a top electrode on the resistive switching layer.

15. The method of claim 13, wherein the forming the resistive random access memory stack comprises:
 forming a resistive switching layer in the drain-side contact opening and on the physically exposed surface of the faceted drain-side structure; and
 forming a top electrode on the resistive switching layer.

16. The method of claim 13, further comprising forming a drain contact metal on a surface of a top electrode of the resistive random access memory stack.

17. The method of claim 16, further comprising forming a drain-side contact structure contacting the drain contact metal, a source-side contact structure contacting the faceted source-side structure, and a gate contact structure contacting a gate conductor of the gate structure.

18. The method of claim 13, wherein the forming of the faceted drain-side structure comprises:
 epitaxially growing a faceted and doped drain-side semiconductor material; and
 forming a drain-side metal semiconductor alloy in an upper portion of the faceted and doped drain-side semiconductor material.

19. The method of claim 13, wherein the fully depleted semiconductor channel material layer is located on an insulator layer, and the insulator layer is located on a handle substrate.

20. The method of claim 13, wherein an isolation structure is formed surrounding the fully depleted semiconductor channel material layer.

* * * * *